United States Patent
Naito

(10) Patent No.: US 9,502,546 B2
(45) Date of Patent: Nov. 22, 2016

(54) SEMICONDUCTOR DEVICE AND SEMICONDUCTOR DEVICE MANUFACTURING METHOD

(71) Applicant: FUJI ELECTRIC CO., LTD., Kawasaki-shi (JP)

(72) Inventor: Tatsuya Naito, Kawasaki (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/718,554

(22) Filed: May 21, 2015

(65) Prior Publication Data

US 2016/0035868 A1 Feb. 4, 2016

(30) Foreign Application Priority Data

Jul. 31, 2014 (JP) .................................. 2014-156964

(51) Int. Cl.
*H01L 21/00* (2006.01)
*H01L 29/739* (2006.01)
(Continued)

(52) U.S. Cl.
CPC ......... *H01L 29/7397* (2013.01); *H01L 21/266* (2013.01); *H01L 21/26513* (2013.01);
(Continued)

(58) Field of Classification Search
CPC ............... H01L 29/7397; H01L 21/266; H01L 29/0821
See application file for complete search history.

(56) References Cited

U.S. PATENT DOCUMENTS

2009/0020852 A1 1/2009 Harada
2012/0074489 A1* 3/2012 Hsieh .................. H01L 29/7813
257/330

FOREIGN PATENT DOCUMENTS

JP 11345969 A 12/1999
JP 2009026797 A 2/2009

* cited by examiner

*Primary Examiner* — Laura Menz
(74) *Attorney, Agent, or Firm* — Rossi, Kimms & McDowell LLP

(57) ABSTRACT

A semiconductor device and manufacturing method achieve miniaturization, prevent rise in threshold voltage and on-state voltage, and prevent decrease in breakdown resistance. $N^+$-type emitter region and $p^{++}$-type contact region are repeatedly alternately disposed in a first direction in which a trench extends in stripe form in a mesa portion sandwiched between trench gates. $P^+$-type region covers an end portion on lower side of junction interface between $n^+$-type emitter region and $p^{++}$-type contact region. Formation of trench gate structure is such that $n^+$-type emitter region is selectively formed at predetermined intervals in the first direction in the mesa portion by first ion implantation. $P^+$-type region is formed less deeply than $n^+$-type emitter region in the entire mesa portion by second ion implantation. The $p^{++}$-type contact region is selectively formed inside the p+-type region by third ion implantation. $N^+$-type emitter region and $p^{++}$-type contact region are diffused and brought into contact.

2 Claims, 12 Drawing Sheets

(51) Int. Cl.
    *H01L 21/265*   (2006.01)
    *H01L 21/266*   (2006.01)
    *H01L 29/06*    (2006.01)
    *H01L 29/08*    (2006.01)
    *H01L 29/10*    (2006.01)
    *H01L 29/66*    (2006.01)
(52) U.S. Cl.
    CPC ....... *H01L 29/0615* (2013.01); *H01L 29/0804* (2013.01); *H01L 29/0821* (2013.01); *H01L 29/1004* (2013.01); *H01L 29/66348* (2013.01)

SEMICONDUCTOR DEVICE AND SEMICONDUCTOR DEVICE MANUFACTURING METHOD

BACKGROUND OF THE INVENTION

A. Field of the Invention

The present invention relates to a semiconductor device and semiconductor device manufacturing method.

B. Description of the Related Art

To date, insulated gate bipolar transistors (IGBTs) have been in the public domain as power semiconductor devices used in industrial machines and automobiles, domestic electrical appliances, and the like. Among power semiconductor devices, IGBTs in particular have good gate control, and can achieve low on-state voltage owing to a conductivity modulation effect. Also, two kinds of structure are widely known as MOS gate (an insulated gate formed of metal-oxide-semiconductor) structures of a power semiconductor device, those being a planar gate structure wherein a MOS gate is provided in plate form on a semiconductor substrate, and a trench gate structure wherein a MOS gate is embedded inside a trench formed in a semiconductor substrate.

The trench gate structure can be provided with a finer cell structure than the planar gate structure. Also, the trench gate structure does not have a JFET region (a portion wherein current concentrates in a region sandwiched by neighboring p-type base regions) peculiar to the planar gate structure. Therefore, the on-state voltage can be reduced further in the trench gate structure than in the planar gate structure. Also, when the IGBT is in an on-state, the larger part of a drop in on-state voltage, which causes conduction loss, is a voltage drop in a drift layer. Therefore, increasing a so-called injection enhancement (IE) effect, wherein carriers (electrons and holes) are confined as far as possible to the drift layer, also leads to low on-state voltage.

As a front surface structure having the IE effect, for example, there is a structure (hereafter referred to as a first existing structure) wherein a plurality of trenches are disposed at a short pitch in a stripe form planar layout, and an $n^+$-type emitter region and $p^{++}$-type contact region are repeatedly alternately disposed at constant intervals in a region of a $p^-$-type base region sandwiched by neighboring trenches (hereafter referred to as a mesa portion) in a first direction in which the trenches extend in stripe form. By adopting the first existing structure, the mesa portion can be miniaturized (the width (distance between trenches) of the mesa portion in a second direction perpendicular to the first direction reduced) in a state wherein the area occupied by the $n^+$-type emitter region in the mesa portion is maintained, and the IE effect can thus be increased while maintaining on-state voltage Von.

Also, a structure (hereafter referred to as a second existing structure) wherein the $p^{++}$-type contact region is disposed in a linear planar layout extending in the first direction in a central portion of the mesa portion, and the $n^+$-type emitter region is disposed between the $p^{++}$-type contact region and a trench, is such that a threshold voltage Vth rises due to encroachment of the $p^{++}$-type contact region into a channel portion, because of which there is a limit to miniaturization of the mesa portion. Encroachment of the $p^{++}$-type contact region into the channel portion means that the $p^{++}$-type contact region is diffused into a portion of the $p^-$-type base region sandwiched by the $n^+$-type emitter region and an $n^-$-type drift layer (a portion of the $p^-$-type base region in the vicinity of a side wall of a trench in which the channel (n-type inversion layer) is formed). By adopting the first existing structure, miniaturization of the mesa portion is possible, while restricting a rise in the threshold voltage Vth, even when encroachment of the $p^{++}$-type contact region into the channel portion occurs.

Next, a description will be given of an existing surface structure having the IE effect, with the first existing structure as an example. FIG. 17 is a plan view showing the planar layout of a trench gate structure of an existing semiconductor device. FIG. 18 is a sectional view showing the sectional structure along a section line AA-AA' of FIG. 17. FIG. 19 is a sectional view showing the sectional structure along a section line BB-BB' of FIG. 17. FIG. 20 is a sectional view showing the sectional structure along a section line CC-CC' of FIG. 17. The section line AA-AA' passes through a trench 103 and a $p^{++}$-type contact region 107. The section line BB-BB' passes through the trench 103 and an $n^+$-type emitter region 106. The section line CC-CC' passes through the $n^+$-type emitter region 106 and $p^{++}$-type contact region 107. A gate dielectric, interlayer dielectric, source electrode, and passivation film are omitted from FIG. 17.

As shown in FIGS. 17 to 20, a plurality of trenches 103 are provided penetrating a $p^-$-type base region 102 to reach an $n^-$-type drift layer 101. The plurality of trenches 103 are disposed in a stripe form planar layout. A gate electrode 105 is embedded across a gate dielectric 104 inside the trench 103. The $n^+$-type emitter region 106 and $p^{++}$-type contact region 107 are repeatedly alternately disposed at constant intervals in a mesa portion sandwiched between neighboring trenches 103, in a first direction in which the trenches 103 extend in stripe form. The $n^+$-type emitter region 106 and $p^{++}$-type contact region 107 are both of a width such as to reach the side wall of the trench 103 on either side in a second direction perpendicular to the first direction.

Next, a description will be given of an existing semiconductor device manufacturing method, with a case of forming the first existing structure as an example. FIGS. 21 to 23 are sectional views showing a state partway through manufacture of the existing semiconductor device. FIGS. 21 to 23 show sectional structures partway through manufacture along the section line CC-CC' of FIG. 17. Firstly, as shown in FIG. 21, the $p^-$-type base region 102, a trench, a gate dielectric, and a gate electrode are formed in the front surface side of a semiconductor substrate that forms the $n^-$-type drift layer 101. Next, a resist mask (not shown) in which are opened portions corresponding to formation regions of the $n^+$-type emitter region 106 is formed on the substrate front surface. Next, an ion implantation of an n-type impurity is carried out with the resist mask as a mask, thereby selectively forming the $n^+$-type emitter region 106 at constant intervals in the first direction in a mesa portion sandwiched between neighboring trenches.

Next, as shown in FIG. 22, a resist mask 111 in which are opened portions corresponding to formation regions of the $p^{++}$-type contact region 107 is formed on the substrate front surface. Intervals W101 on the mask between n+-type emitter regions 106 and $p^{++}$-type contact regions 107 neighboring in the first direction are created at predetermined intervals. Next, an ion implantation 112 of a p-type impurity is carried out with the resist mask 111 as a mask. The dotted line in the vicinity of the surface of the $p^-$-type base region 102 in FIG. 22 indicates the p-type impurity implanted by the ion implantation 112. The $p^{++}$-type contact region 107 is formed by the ion implantation 112 between n+-type emitter regions 106 neighboring in the first direction, distanced from the $n^+$-type emitter regions 106. Next, after the resist mask 111 is removed, the trench gate IGBT is completed by a thermal processing (thermal diffusion process) step for causing the impurity to diffuse, steps of forming the remaining portions that configure the element structure, and the like, being carried out.

Also, a structure wherein an emitter layer is provided in stripe form in a direction perpendicular to an effective gate trench region connected to a gate electrode and a dummy trench region separated from the gate electrode has been proposed as another surface structure having the IE effect (for example, refer to JP-A-2009-026797). JP-A-2009-026797 is such that, by optimizing trench pitch and emitter region width, the resistance of a reverse bias safe operating area (RBSOA) is secured, and variation of the saturation current is restricted.

Also, the following structure has been proposed as another surface structure having the IE effect. An n-type emitter region and p-type contact region with high impurity concentrations are alternately formed in contact with a trench side surface in the trench longitudinal direction (channel width direction) in the surface of a p-type base region. The p-type contact region has a pattern such that the p-type contact region is not in contact with an edge portion of the n-type emitter region in contact with the trench in a place where a channel is formed (for example, refer to JP-A-11-345969 (Paragraphs 0069 and 0177, FIG. 31)).

The present invention is directed to overcoming or at least reducing the effects of one or more of the problems set forth above.

SUMMARY OF THE INVENTION

However, the first existing structure (refer to FIGS. 17 to 23) is such that, when there is variation in intervals W102 between $n^+$-type emitter regions 106 and $p^{++}$-type contact regions 107 neighboring in the first direction due to mask pattern variation or process variation (hereafter referred to simply as process variation), there is a considerable adverse effect on element characteristics. For example, when the intervals W102 between $n^+$-type emitter regions 106 and $p^{++}$-type contact regions 107 neighboring in the first direction are narrower than the design value due to process variation, encroachment of the $p^{++}$-type contact region 107 into the channel portion occurs. Therefore, there is a problem in that the width in the first direction of the $n^+$-type emitter region 106 (the channel width) decreases, and the threshold voltage Vth and on-state voltage Von rise.

Meanwhile, when the intervals W102 between $n^+$-type emitter regions 106 and $p^{++}$-type contact regions 107 neighboring in the first direction are wider than the design value due to process variation, the $n^+$-type emitter region 106 diffuses into the $p^-$-type base region 102 remaining between the $n^+$-type emitter region 106 and $p^{++}$-type contact region 107, and the width in the first direction of the $n^+$-type emitter region 106 increases. Therefore, there is a problem in that short-circuit resistance and latch-up resistance (hereafter referred to collectively as breakdown resistance) decreases. Also, as well as low on-state voltage, high speed switching characteristics are also required of a power semiconductor device, because of which improvement of high speed switching characteristics (a reduction of switching loss Eoff), which are in a trade-off relationship with the low on-state voltage Von, is also an important problem.

The invention, in order to resolve the problems of the heretofore described existing technology, has an object of providing a semiconductor device and semiconductor device manufacturing method such that it is possible to achieve miniaturization, and to prevent a rise in threshold voltage and on-state voltage and prevent a decrease in breakdown resistance, while maintaining a good trade-off relationship between on-state voltage and switching loss.

In order to resolve the heretofore described problems, thereby achieving the object of the invention, a semiconductor device manufacturing method according to an aspect of the invention is a method of manufacturing a semiconductor device of a trench gate structure including first conductivity type first and third semiconductor regions and second conductivity type second and fourth semiconductor regions, and includes the following characteristics. The second semiconductor region is provided on one surface side of the first semiconductor region. A plurality of trenches are provided penetrating the second semiconductor region in the depth direction to reach the first semiconductor region. The plurality of trenches are disposed in a stripe form planar pattern. A gate electrode is provided across a gate dielectric inside the trench. The third semiconductor region is selectively provided in a mesa portion of the second semiconductor region sandwiched between neighboring trenches. The fourth semiconductor region is provided in contact with the third semiconductor region in the mesa portion. The impurity concentration of the fourth semiconductor region is higher than the impurity concentration of the second semiconductor region. When manufacturing this kind of trench gate structure semiconductor device, firstly, a first step of selectively forming the third semiconductor region at predetermined intervals in the mesa portion in a first direction in which the trench extends in stripe form is carried out. Next, a second step of forming a second conductivity type fifth semiconductor region with an impurity concentration higher than that of the second semiconductor region in the whole of a portion of the mesa portion sandwiched between third semiconductor regions neighboring in the first direction is carried out. Next, a third step of selectively forming the fourth semiconductor region with an impurity concentration higher than that of the fifth semiconductor region, distanced from the third semiconductor region, inside the fifth semiconductor region is carried out. Next, a fourth step of diffusing and bringing into contact the third semiconductor region and fourth semiconductor region in fifth semiconductor regions neighboring in the first direction is carried out so that the third semiconductor region and fourth semiconductor region are repeatedly alternately disposed in the first direction.

Also, the semiconductor device manufacturing method according to the aspect of the invention is such that the fifth semiconductor region is left on the first semiconductor region side of the junction interface between the third semiconductor region and fourth semiconductor region in the fourth step.

Also, the semiconductor device manufacturing method according to the aspect of the invention is such that the fifth semiconductor region is formed to a depth equal to or less than the depth of the third semiconductor region in the second step.

Also, the semiconductor device manufacturing method according to the aspect of the invention is such that the fifth semiconductor region is formed to be deeper than the depth of the third semiconductor region and less deep than the depth of the fourth semiconductor region in the second step.

Also, the semiconductor device manufacturing method according to the aspect of the invention is such that the fifth semiconductor region is formed in the whole of the mesa portion by a second conductivity type impurity being ion implanted in the second step.

Also, the semiconductor device manufacturing method according to the aspect of the invention further includes the following characteristics. A first mask step of forming a first mask in which are opened portions corresponding to formation regions of the third semiconductor region on the surface of the mesa portion is carried out before the first step. A step of removing the first mask is carried out after the first step and before the second step. A second mask step of forming a second mask in which are opened portions corresponding to formation regions of the fourth semiconductor region on the surface of the mesa portion is carried out after the second step and before the third step. The third semiconductor region is formed by a first conductivity type impurity being ion implanted with the first mask as a mask in the first step. The fourth semiconductor region is formed by a second conductivity type impurity being ion implanted with the second mask as a mask in the third step. Further, the interval between a region exposed by the first mask and a region exposed by the second mask is 0.4 μm or greater, 1.21 μm or less.

Also, the semiconductor device manufacturing method according to the aspect of the invention further includes the following characteristics. A second mask step of forming a second mask in which are opened portions corresponding to formation regions of the fourth semiconductor region on the surface of the mesa portion is carried out after the first step and before the second step. Further, the fifth semiconductor region is formed by a first second conductivity type impurity being ion implanted with the second mask as a mask in the second step. The fourth semiconductor region is formed by a second conductivity type impurity of a diffusion coefficient lower than that of the first second conductivity type impurity being ion implanted with the second mask as a mask in the third step.

Also, the semiconductor device manufacturing method according to the aspect of the invention further includes the following characteristics. A first mask step of forming a first mask in which are opened portions corresponding to formation regions of the third semiconductor region on the surface of the mesa portion is carried out before the first step. Further, the third semiconductor region is formed by a first conductivity type impurity being ion implanted with the first mask as a mask in the first step. The interval between a region exposed by the first mask and a region exposed by the second mask is 0.4 μm or greater, 1.21 μm or less.

Also, in order to resolve the heretofore described problems, thereby achieving the object of the invention, a semiconductor device according to an aspect of the invention includes the following characteristics. A second conductivity type second semiconductor region is provided on one surface side of a first conductivity type first semiconductor region. A plurality of trenches are provided penetrating the second semiconductor region in the depth direction to reach the first semiconductor region. The plurality of trenches are disposed in a stripe form planar pattern. A gate electrode is provided across a gate dielectric inside the trench. A first conductivity type third semiconductor region is selectively provided at predetermined intervals in a first direction in which the trench extends in stripe form in a mesa portion of the second semiconductor region sandwiched between neighboring trenches. A second conductivity type fourth semiconductor region is provided in contact with the third semiconductor region in the mesa portion so as to be repeatedly alternately disposed with the third semiconductor region in the first direction. The impurity concentration of the fourth semiconductor region is higher than the impurity concentration of the second semiconductor region. A second conductivity type fifth semiconductor region is selectively provided so as to cover an end portion on the first semiconductor region side of the junction interface between the third semiconductor region and fourth semiconductor region. The impurity concentration of the fifth semiconductor region is higher than the impurity concentration of the second semiconductor region and lower than the impurity concentration of the fourth semiconductor region.

Also, the semiconductor device according to the aspect of the invention is such that the depth of the fifth semiconductor region is equal to or less than the depth of the third semiconductor region.

Also, the semiconductor device according to the aspect of the invention is such that the depth of the fifth semiconductor region is greater than the depth of the third semiconductor region and less than the depth of the fourth semiconductor region.

According to the invention, the width in the first direction of the lower end of a third semiconductor region can be prevented from increasing due to thermal processing by a fifth semiconductor region with an impurity concentration higher than that of a second semiconductor region and an impurity concentration lower than that of a fourth semiconductor region being formed between the third semiconductor region and fourth semiconductor region neighboring in the first direction. Therefore, a decrease in breakdown resistance (short-circuit resistance and latch-up resistance) can be prevented. Also, according to the invention, encroachment of the fourth semiconductor region into a channel portion can be prevented. Therefore, the width in the first direction of the third semiconductor region does not decrease. Therefore, threshold voltage and on-state voltage can be prevented from rising.

According to the semiconductor device and semiconductor device manufacturing method according to the invention, advantages are obtained in that miniaturization of a trench gate semiconductor device can be achieved by a plurality of trenches being disposed at a short pitch, and threshold voltage and on-state voltage can be prevented from rising, and breakdown resistance prevented from decreasing, while maintaining a good trade-off relationship between on-state voltage and switching loss.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Hereafter, referring to the attached drawings, a detailed description will be given of preferred embodiments of a semiconductor device and semiconductor device manufacturing method of the invention. In the specification and attached drawings, a layer or region being prefixed by n or p means that electrons or holes respectively are majority carriers. Also, + or − attached to n or p indicates a higher impurity concentration or lower impurity concentration respectively than that of a layer or region to which neither is attached. In the following description of the embodiments and in the attached drawings, the same reference signs are given to the same configurations, and redundant descriptions are omitted.

First Embodiment

Figure 1:
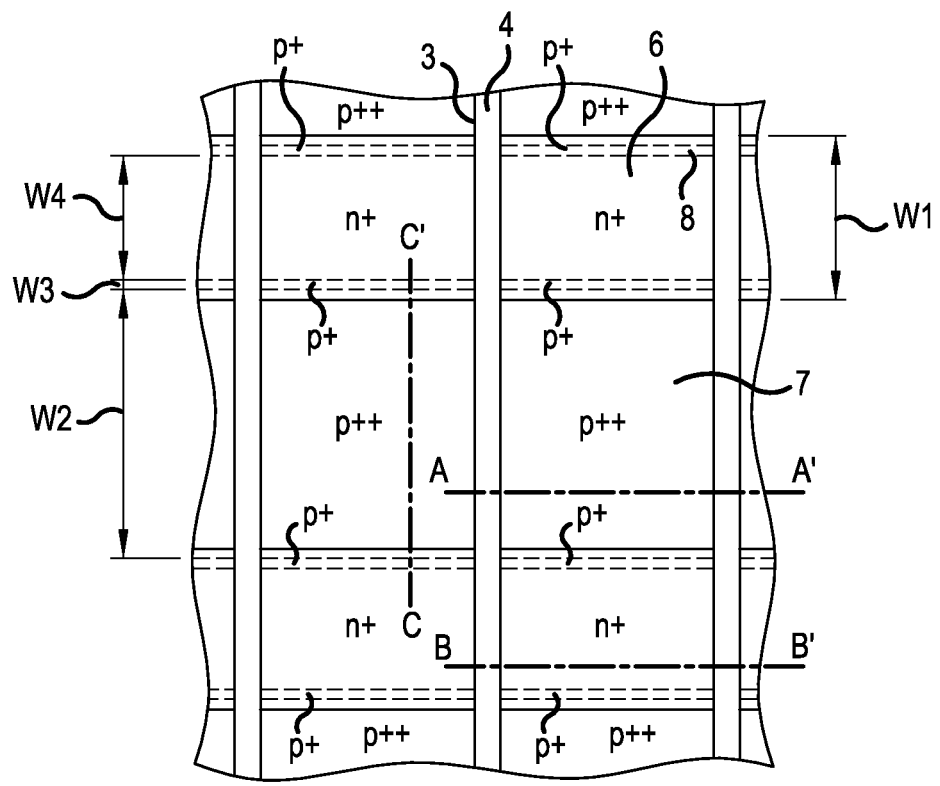
FIG. 1 is a plan view showing the planar layout of a trench gate structure of a semiconductor device according to a first embodiment.
Figure 2:
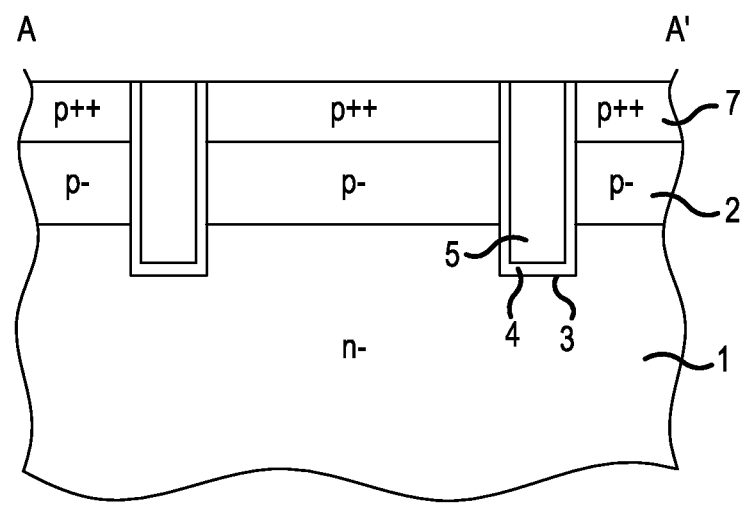
FIG. 2 is a sectional view showing the sectional structure along a section line A-A' of FIG. 1.
Figure 3:
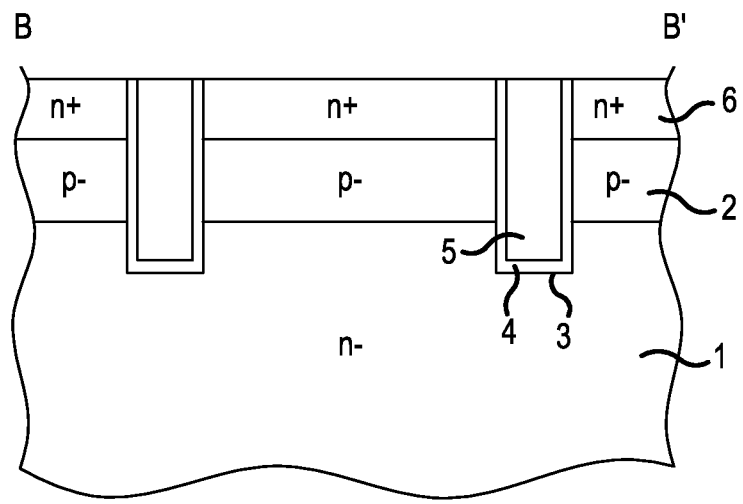
FIG. 3 is a sectional view showing the sectional structure along a section line B-B' of FIG. 1.
Figure 4:
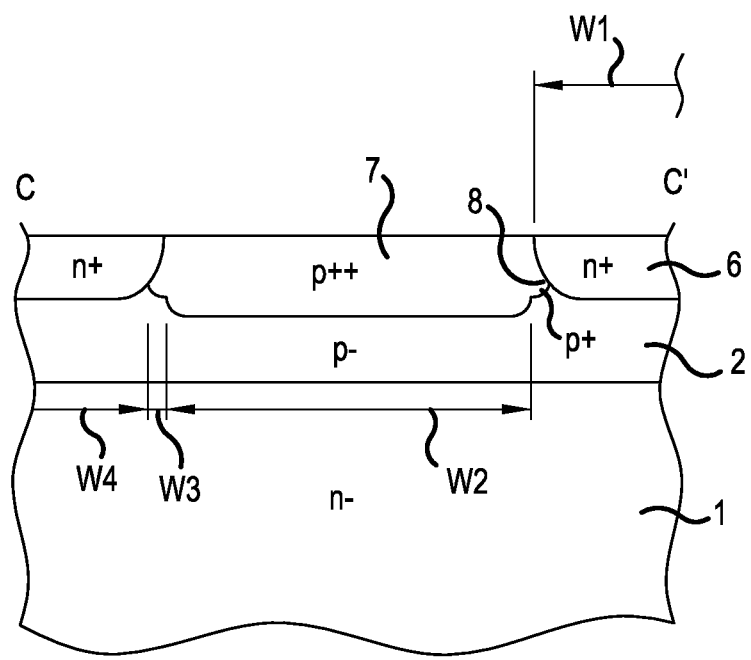
FIG. 4 is a sectional view showing the sectional structure along a section line C-C' of FIG. 1.

A description will be given of the structure of a semiconductor device according to a first embodiment. FIG. 1 is a plan view showing the planar layout of a trench gate structure of the semiconductor device according to the first embodiment. A gate dielectric, interlayer dielectric, source electrode, and passivation film are omitted from FIG. 1 (the same applies to FIGS. 2 to 4, 10, and 14). FIG. 2 is a sectional view showing the sectional structure along a section line A-A' of FIG. 1. FIG. 3 is a sectional view showing the sectional structure along a section line B-B' of FIG. 1. FIG. 4 is a sectional view showing the sectional structure along a section line C-C' of FIG. 1. The section line A-A' passes through a trench 3 and a $p^{++}$-type contact region (fourth semiconductor region) 7. The section line B-B' passes through the trench 3 and an $n^+$-type emitter region (third semiconductor region) 6. The section line C-C' passes through the $n^+$-type emitter region 6, the $p^{++}$-type contact region 7, and a $p^+$-type region (fifth semiconductor region) 8.

As shown in FIGS. 1 to 4, the semiconductor device according to the first embodiment includes a trench gate MOS gate structure formed of a trench 3, a gate dielectric 4, a gate electrode 5, the $n^+$-type emitter region 6, and the $p^{++}$-type contact region 7. Firstly, a description will be given of the planar layout of the trench gate structure of the semiconductor device according to the first embodiment. A plurality of the trench 3 are disposed in, for example, stripe form at predetermined intervals (pitch) on a substrate front surface side (emitter side). The $n^+$-type emitter region 6 and $p^{++}$-type contact region 7 are repeatedly alternately disposed at constant intervals, in a first direction (the vertical direction in the drawings) in which the trenches 3 extend in stripe form, in each mesa portion of a $p^-$-type base region (second semiconductor region) 2 sandwiched by neighboring trenches 3. The $n^+$-type emitter region 6 and $p^{++}$-type contact region 7 are in contact with each other in the first direction.

The $p^+$-type region 8 is provided on the lower side (collector side) of the $n^+$-type emitter region 6 at the junction interface between the $n^+$-type emitter region 6 and $p^{++}$-type contact region 7. The $n^+$-type emitter region 6, $p^{++}$-type contact region 7, and $p^+$-type region 8 are each of a width such as to reach the trench 3 side wall on either side in a second direction (the horizontal direction in the drawings) perpendicular to the first direction. The $n^+$-type emitter region 6, $p^{++}$-type contact region 7, and $p^+$-type region 8 disposed in one mesa portion sandwiched between neighboring trenches 3 configure one unit cell (element functional unit). FIG. 1 shows an active region wherein unit cells are repeatedly disposed in mesa portions aligned in the second direction perpendicular to the first direction. An active region is a region through which current flows (a region responsible for current drive) when in an on-state.

An emitter electrode (not shown) is electrically connected to the $n^+$-type emitter region 6 and $p^{++}$-type contact region 7 via contact holes that penetrate an interlayer dielectric (not shown). The contact holes, for example, may be of a stripe form planar layout extending in the first direction in a central portion of each mesa portion, or may be of a planar layout such that a rectangular or circular planar pattern is disposed in matrix form. The emitter electrode is electrically isolated from the gate electrode 5 inside the trench 3 by the interlayer dielectric. A passivation film (not shown) is provided on the emitter electrode. An n-type buffer layer, a $p^+$-type collector layer, and a collector electrode, omitted from the drawings, are provided on the substrate back surface side (collector side).

A width W1 in the first direction of the $n^+$-type emitter region 6 is less than, for example, a width W2 in the first direction of the $p^{++}$-type contact region 7. Specifically, it is preferable that the width W1 in the first direction of the n$^+$-type emitter region 6 is in the region of, for example, 0.6 µm or more, 1.41 µm or less, and may be, for example, 1.0 µm in the case of a breakdown voltage class of 600V. It is preferable that the width W2 in the first direction of the p$^{++}$-type contact region 7 is in the region of, for example, 1.8 µm or more, 4.21 µm or less, and may be, for example, 3.0 µm in the case of a breakdown voltage class of 600V. It is preferable that a width W3 in the first direction of the p$^+$-type region 8 is in the region of, for example, 0.4 µm or more, 1.21 µm or less, and may be, for example, 0.8 µm in the case of a breakdown voltage class of 600V.

Next, a description will be given of the sectional structure of the trench gate structure of the semiconductor device according to the first embodiment. As shown in FIGS. 2 to 4, the p$^-$-type base region 2 is provided on the front surface side of a semiconductor substrate (semiconductor chip) that forms an n$^-$-type drift (first semiconductor region) layer 1. The trench 3 penetrates the p$^-$-type base region 2 from the substrate front surface, reaching the n$^-$-type drift layer 1. The gate electrode 5 is embedded across the gate dielectric 4 inside the trench 3. The n$^+$-type emitter region 6 and p$^{++}$-type contact region 7 are each selectively provided in a surface layer on the side of the p$^-$-type base region 2 opposite to that of the n$^-$-type drift layer 1.

The depth of the p$^{++}$-type contact region 7 is greater than, for example, the depth of the n$^+$-type emitter region 6. Therefore, latch-up of a parasitic thyristor formed of a p$^+$-type collector layer, the n$^-$-type drift layer 1, the p$^-$-type base region 2, and the n$^+$-type emitter region 6, which occurs due to the size of a width W4 in the first direction of the n$^+$-type emitter region 6 at the junction interface between the n$^+$-type emitter region 6 and p$^-$-type base region 2 (hereafter referred to as the width in the first direction of the lower end of the n$^+$-type emitter region 6), is unlikely to occur. It is preferable that the impurity concentration of the p$^{++}$-type contact region 7 is in the region of, for example, 2.6×10$^{20}$/cm$^3$ or more, 6×10$^{20}$/cm$^3$ or less, and may be, for example, 4.2×10$^{20}$/cm$^3$ in the case of a breakdown voltage class of 600V.

The p$^+$-type region 8 is in contact with the n$^+$-type emitter region 6 and p$^{++}$-type contact region 7, and covers an end portion on the lower side (collector side) of the junction interface between the n$^+$-type emitter region 6 and p$^{++}$-type contact region 7. The p$^+$-type region 8 is not exposed in the surface of the p$^-$-type base region 2 on the side opposite to that of the n$^-$-type drift layer 1. That is, the p$^+$-type region 8 supplements the p-type impurity concentration of the p$^-$-type base region 2 in the vicinity of an end portion on the lower side of the junction interface between the n$^+$-type emitter region 6 and p$^{++}$-type contact region 7. Even when one end portion of the two end portions in the first direction of the p$^+$-type region 8 is exposed in the surface of the p$^-$-type base region 2 on the side opposite to that of the n$^-$-type drift layer 1 due to process variation, the advantages of providing the p$^+$-type region 8 can be obtained.

Also, it is preferable that the p$^+$-type region 8 is provided so that the curvature of the end portion in the first direction of the p$^{++}$-type contact region 7 is increased, and unevenness occurring in the end portion on the lower side of the junction interface between the n$^+$-type emitter region 6 and p$^{++}$-type contact region 7 is practically eliminated. The reason for this is that it is possible to relax electrical field concentration in the vicinity of the end portion on the lower side of the junction interface between the n$^+$-type emitter region 6 and p$^{++}$-type contact region 7. Therefore, it is possible to restrict avalanche breakdown in the vicinity of the end portion on the lower side of the junction interface between the n$^+$-type emitter region 6 and p$^{++}$-type contact region 7, and thus possible to increase breakdown voltage. Also, as carriers are unlikely to be generated in the vicinity of the end portion on the lower side of the junction interface between the n$^+$-type emitter region 6 and p$^{++}$-type contact region 7, latch-up of the parasitic thyristor is unlikely to occur.

Also, by providing the p$^+$-type region 8, the width in the first direction of the p-type high concentration regions (the p$^{++}$-type contact region 7 and p$^+$-type region 8) inside the p$^-$-type base region 2 increases, as a result of which carriers implanted from the collector side can more easily be drawn out to the emitter electrode. Therefore, switching loss Eoff can be reduced. Also, the p$^+$-type region 8 is disposed in a position such that the width W4 in the first direction of the lower end of the n$^+$-type emitter region 6 can be maintained at a predetermined width. Therefore, it is possible to secure a predetermined channel width (the total value of the widths W4 in the first direction of the lower ends of the n$^+$-type emitter regions 6 inside one mesa portion), because of which it is possible to prevent the threshold voltage Vth and on-state voltage Von from rising.

The depth of the p$^+$-type region 8 is less than the depth of the p$^{++}$-type contact region 7. Also, the depth of the p$^+$-type region 8 is less than the depth of the n$^+$-type emitter region 6, or of the same extent as the depth of the n$^+$-type emitter region 6. The impurity concentration of the p$^+$-type region 8 is lower than the impurity concentrations of the n$^+$-type emitter region 6 and p$^{++}$-type contact region 7, and higher than the impurity concentration of the p$^-$-type base region 2. Specifically, it is preferable that the impurity concentration of the p$^+$-type region 8 is in the region of, for example, 6.5×10$^{19}$/cm$^3$ or more, 2.6×10$^{20}$/cm$^3$ or less, and may be, for example, 1.3×10$^{20}$/cm$^3$ in the case of a breakdown voltage class of 600V.

Figure 5:
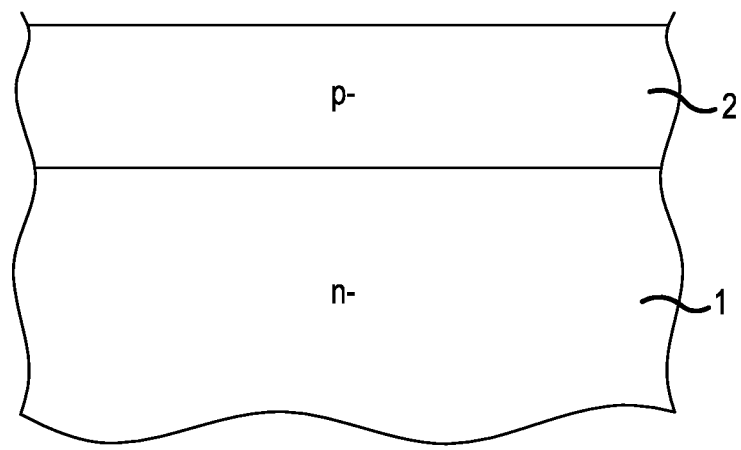
FIG. 5 is a sectional view showing a state partway through the manufacture of the semiconductor device according to the first embodiment.

Next, a description will be given of a semiconductor device manufacturing method according to the first embodiment. FIGS. 5 to 9 are sectional views showing states partway through the manufacture of the semiconductor device according to the first embodiment. FIGS. 5 to 9 show sectional structures partway through manufacture along the section line C-C' of FIG. 1. Firstly, as shown in FIG. 5, the p$^-$-type base region 2 is formed on the front surface side of a semiconductor substrate that forms the n$^-$-type drift layer 1. The p$^-$-type base region 2 may be formed by ion implantation in a surface layer of the front surface of the semiconductor substrate, or it may be grown by epitaxial growth on the front surface of the semiconductor substrate. When forming the p$^-$-type base region 2 by ion implantation, the ion implantation dose may be in the region of, for example, 1×10$^{14}$/cm$^2$.

When forming the p$^-$-type base region 2 by ion implantation, the substrate referred to in the following description indicates the semiconductor substrate that forms the n$^-$-type drift layer 1. Meanwhile, when forming the p$^-$-type base region 2 by epitaxial growth, the substrate referred to in the following description indicates an epitaxial substrate wherein epitaxial layers that form the p$^-$-type base region 2 are stacked on the semiconductor substrate that forms the n$^-$-type drift layer 1.

Figure 6:
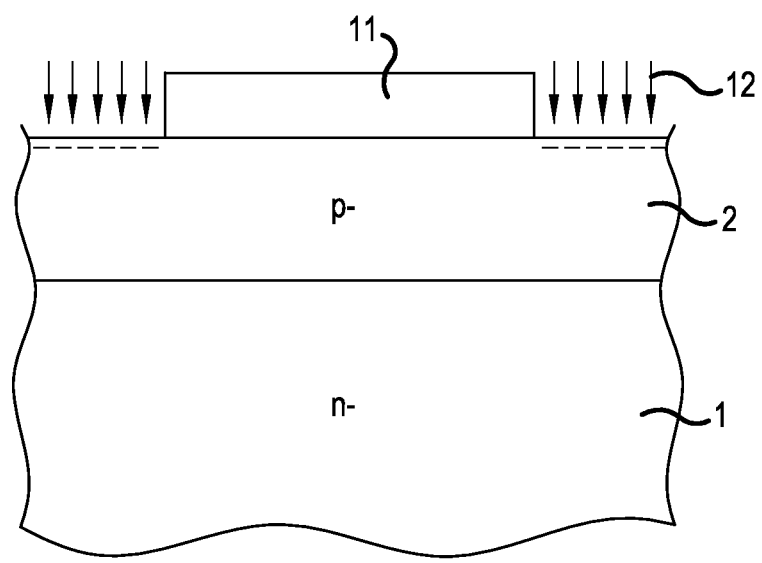
FIG. 6 is a sectional view showing a state partway through the manufacture of the semiconductor device according to the first embodiment.

Next, a resist mask (not shown) in which are opened portions corresponding to formation regions of the trench 3 is formed. Next, etching is carried out with the resist mask as a mask, thereby forming a plurality of the trench 3 (not shown in FIGS. 5 to 9) in, for example, a stripe form planar layout, and of a depth penetrating the p$^-$-type base region 2 to reach the n$^-$-type drift layer 1. Next, after removing the resist mask, the gate electrode 5 is formed using a general method across the gate dielectric 4 inside the trench 3 (not shown in FIGS. 5 to 9). Next, a resist mask 11 in which are opened portions corresponding to formation regions of the $n^+$-type emitter region 6 is formed, as shown in FIG. 6.

Figure 7:
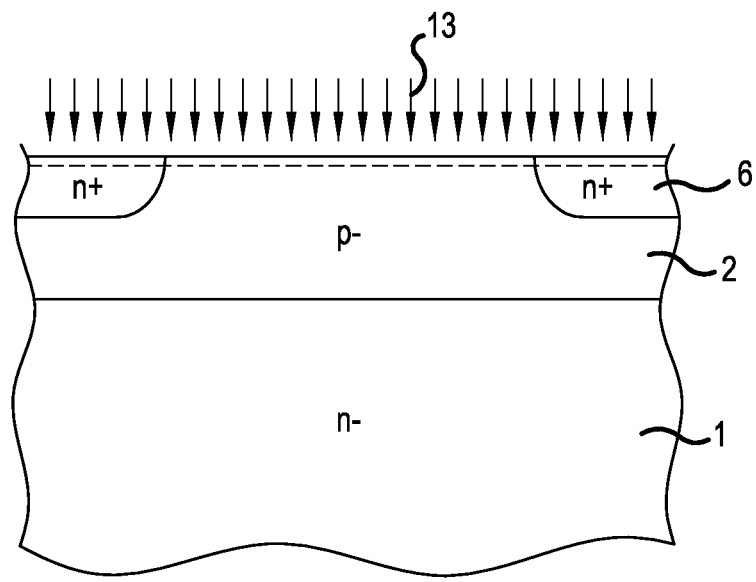
FIG. 7 is a sectional view showing a state partway through the manufacture of the semiconductor device according to the first embodiment.

Next, with the resist mask (first mask) 11 as a mask, a first ion implantation 12 of an n-type impurity such as arsenic (As) is carried out in order to form the $n^+$-type emitter region 6. The $n^+$-type emitter region 6 is selectively formed by the first ion implantation 12 at predetermined intervals in the first direction in each mesa portion sandwiched by neighboring trenches 3. Next, the resist mask 11 is removed. Next, as shown in FIG. 7, a second ion implantation 13 of a p-type impurity such as boron (B) is carried out, without using a resist mask, in order to form the $p^+$-type region 8 over the whole of the substrate front surface (that is, over the whole of each mesa portion sandwiched by neighboring trenches). The dotted line in the vicinity of the surface of the $p^-$-type base region 2 and $n^+$-type emitter region 6 in FIG. 7 indicates the p-type impurity implanted by the second ion implantation 13.

Figure 8:
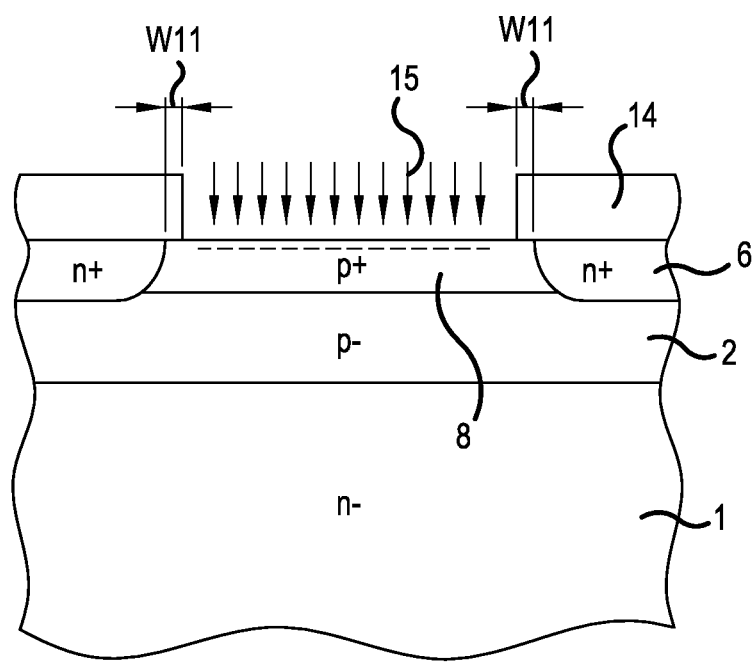
FIG. 8 is a sectional view showing a state partway through the manufacture of the semiconductor device according to the first embodiment.

In this way, the second ion implantation 13 for forming the $p^+$-type region 8 is carried out over the whole of the substrate front surface, without using a resist mask. The second ion implantation 13 is carried out with low dose so that the $n^+$-type emitter regions 6 does not invert to p-type. Therefore, reduction in the area of the mesa portion occupied by the $n^+$-type emitter region 6 is prevented, and the $p^+$-type region 8 is reliably formed in the whole of the portion of the $p^-$-type base region 2 sandwiched between $n^+$-type emitter regions 6 neighboring in the first direction, as shown in FIG. 8. Also, the second ion implantation 13 is carried out at a low acceleration voltage such that the $p^+$-type region 8 can be formed less deeply than the $n^+$-type emitter region 6. Therefore, the $p^+$-type region 8 is not formed in a portion of the $p^-$-type base region 2 sandwiched between the n+-type emitter region 6 and $n^-$-type drift layer 1 (a portion of the $p^-$-type base region 2 in the vicinity of the side wall of a trench in which the channel is formed).

Specifically, when the dopant used in the second ion implantation 13 is boron, the dose of the second ion implantation 13 is preferably in the region of, for example, $5 \times 10^{14}$/cm$^2$ or more, $2 \times 10^{15}$/cm$^2$ or less, and may be, for example, $1 \times 10^{15}$/cm$^2$ in the case of a breakdown voltage class of 600V. The acceleration voltage of the second ion implantation 13 is preferably in the region of, for example, 40 keV or more, 80 keV or less, and may be, for example, 60 keV in the case of a breakdown voltage class of 600V.

Next, a resist mask (second mask) 14, in which are opened portions corresponding to formation regions of the $p^{++}$-type contact region 7, is formed on the substrate front surface, as shown in FIG. 8. An interval W11 on the mask between the $n^+$-type emitter region 6 and $p^{++}$-type contact region 7 neighboring in the first direction is preferably in the region of, for example, 0.4 µm or more, 1.21 µm or less. The reason for this is that it is possible to prevent encroachment of the $p^{++}$-type contact region 7 into the channel portion. The interval W11 on the mask between the $n^+$-type emitter region 6 and $p^{++}$-type contact region 7 neighboring in the first direction is an interval between an aperture portion of the photomask pattern of the resist mask 14 for forming the $p^{++}$-type contact region 7 and an aperture portion of the photomask pattern of the resist mask 11 for forming the $n^+$-type emitter region 6. Encroachment of the $p^{++}$-type contact region 7 into the channel portion refers to the $p^{++}$-type contact region 7 being diffused as far as a portion of the $p^-$-type base region 2 sandwiched between the $n^+$-type emitter region 6 and $n^-$-type drift layer 1 in a thermal processing to be described hereafter.

Figure 9:
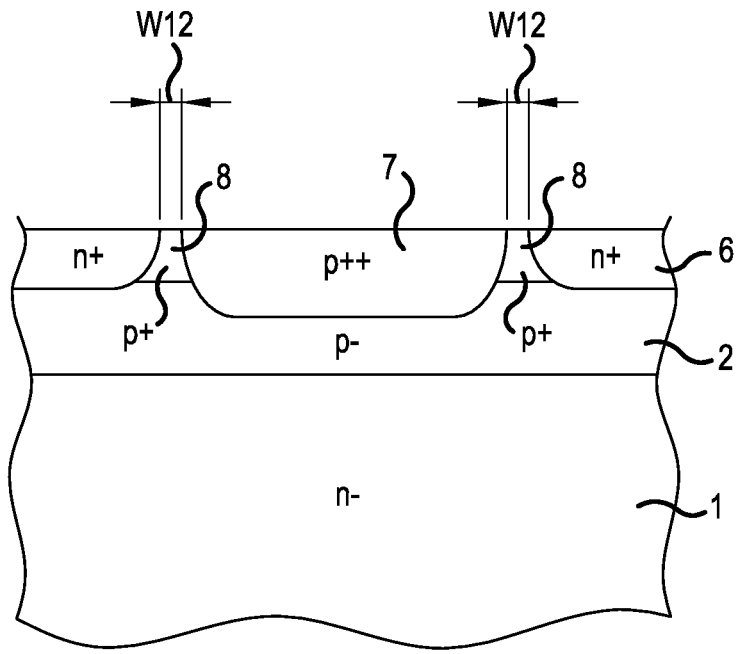
FIG. 9 is a sectional view showing a state partway through the manufacture of the semiconductor device according to the first embodiment.

Next, with the resist mask 14 as a mask, a third ion implantation 15 of a p-type impurity such as boron is carried out in order to form the $p^{++}$-type contact region 7. The dotted line in the vicinity of the surface of the $p^+$-type region 8 in FIG. 8 (a coarser dotted line than that in FIG. 7) indicates the p-type impurity implanted by the third ion implantation 15. The $p^{++}$-type contact region 7 is selectively formed by the third ion implantation 15, distanced from the $n^+$-type emitter region 6, in each $p^+$-type region 8 sandwiched between $n^+$-type emitter regions 6 neighboring in the first direction, as shown in FIG. 9. An interval W12 between the n+-type emitter region 6 and $p^{++}$-type contact region 7 neighboring in the first direction is of a dimension based on the interval W11 on the mask between the $n^+$-type emitter region 6 and $p^{++}$-type contact region 7 neighboring in the first direction.

The dimension based on the interval W11 on the mask between the $n^+$-type emitter region 6 and $p^{++}$-type contact region 7 neighboring in the first direction is practically the same as the photomask pattern dimension, or a dimension equivalent to the photomask pattern dimension plus or minus the amount of process variation. Plus or minus the amount of process variation refers to the interval W12 between the $n^+$-type emitter region 6 and $p^{++}$-type contact region 7 neighboring in the first direction being wider or narrower than the design value due to process variation in the intervals between $n^+$-type emitter regions 6 or $p^{++}$-type contact regions 7, or both thereof, neighboring in the first direction.

Also, the $p^{++}$-type contact region 7 is formed by the third ion implantation 15 so as to penetrate in the depth direction the $p^+$-type region 8 sandwiched between $n^+$-type emitter regions 6 neighboring in the first direction, reaching the $p^-$-type base region 2. That is, the $p^+$-type region 8, having a first direction width of practically the same dimension as that of the interval W12 between the $p^{++}$-type contact region 7 and $n^+$-type emitter region 6, remains between the $n^+$-type emitter region 6 and $p^{++}$-type contact region 7. When the dopant of the third ion implantation 15 is boron, the dose of the third ion implantation 15 is preferably in the region of, for example, $2 \times 10^{15}$/cm$^2$ or more, $4.5 \times 10^{15}$/cm$^2$ or less, and may be, for example, $3 \times 10^{15}$/cm$^2$ in the case of a breakdown voltage class of 600V. The acceleration voltage of the third ion implantation 15 is preferably in the region of, for example, 80 keV or more, 160 keV or less, and may be, for example, 120 keV in the case of a breakdown voltage class of 600V.

Next, after removing the resist mask 14, thermal processing (thermal diffusion) is carried out, thereby causing the $n^+$-type emitter region 6 and $p^{++}$-type contact region 7 to diffuse. The $n^+$-type emitter region 6 and $p^{++}$-type contact region 7 are each diffused inside the $p^+$-type regions 8 neighboring in the first direction. As the impurity concentration of the $p^+$-type region 8 is lower than the impurity concentration of the $n^+$-type emitter region 6, the end portion of the $p^+$-type region 8 on the $n^+$-type emitter region 6 side inverts to n-type, forming the $n^+$-type emitter region 6. Also, the end portion of the $p^+$-type region 8 on the $p^{++}$-type contact region 7 side, the p-type impurity concentration increasing, forms the $p^{++}$-type contact region 7. Therefore, the $n^+$-type emitter region 6 and $p^{++}$-type contact region 7 are in contact in the first direction, and the $n^+$-type emitter region 6 and $p^{++}$-type contact region 7 are in a state of being repeatedly alternately disposed in the first direction in a mesa portion sandwiched between neighboring trenches 3.

Also, when carrying out the thermal processing, the p+-type region 8, which has an impurity concentration higher than that of the p⁻-type base region 2, is in a formed state between the n⁺-type emitter region 6 and p⁺⁺-type contact region 7 neighboring in the first direction. Therefore, even when the interval W12 between the n⁺-type emitter region 6 and p⁺⁺-type contact region 7 neighboring in the first direction is wider than the design value due to process variation, the width W4 in the first direction of the lower end of the n⁺-type emitter region 6 barely changes in the thermal processing. Also, the n⁺-type emitter region 6 and p⁺⁺-type contact region 7 are formed with the interval W11 on the mask between the n⁺-type emitter region 6 and p⁺⁺-type contact region 7 neighboring in the first direction set within the heretofore described range. Therefore, even when the interval W12 between the n⁺-type emitter region 6 and p⁺⁺-type contact region 7 neighboring in the first direction is narrower than the design value due to process variation, encroachment of the p⁺⁺-type contact region 7 into the channel portion due to the thermal processing can be prevented.

Via the steps thus far, a unit cell formed by the n⁺-type emitter region 6 and p⁺⁺-type contact region 7 being repeatedly alternated in the first direction is formed in each mesa portion sandwiched by neighboring trenches 3. Also, the p⁺-type region 8 in contact with the n⁺-type emitter region 6 and p⁺⁺-type contact region 7 remains so as to cover an end portion on the lower side of the junction interface between the n⁺-type emitter region 6 and p⁺⁺-type contact region 7. Subsequently, the trench gate IGBT shown in FIGS. 1 to 4 is completed by an interlayer dielectric, emitter electrode, passivation film, and the like, being formed on the substrate front surface side, and a p⁺-type collector layer and collector electrode being formed on the substrate back surface side, using general methods.

As heretofore described, according to the first embodiment, it is possible, by forming a p⁺-type region with an impurity concentration higher than that of a p⁻-type base region and an impurity concentration lower than that of a p⁺⁺-type contact region between an n⁺-type emitter region and p⁺⁺-type contact region neighboring in a first direction, to prevent the width in the first direction of the lower end of the n⁺-type emitter region from increasing due to thermal processing. Therefore, it is possible to prevent a decrease in breakdown resistance (short-circuit resistance and latch-up resistance). Also, according to the first embodiment, encroachment of the p⁺⁺-type contact region into a channel portion can be prevented by the interval on a mask between the n⁺-type emitter region and p⁺⁺-type contact region neighboring in the first direction being set within the heretofore described range. Therefore, the width in the first direction of the n⁺-type emitter region does not decrease. Therefore, threshold voltage and on-state voltage can be prevented from rising.

Also, according to the first embodiment, it is possible, by carrying out a second ion implantation of a p-type impurity over the whole of a mesa portion without using a resist mask, to reliably form the p⁺-type region with an impurity concentration higher than that of the p⁻-type base region in the whole of a portion of the p⁻-type base region sandwiched between n⁺-type emitter regions neighboring in the first direction, even when there is variation in the intervals between n⁺-type emitter regions neighboring in the first direction due to process variation. Consequently, according to the first embodiment, the n⁺-type emitter region and p⁺⁺-type contact region can be repeatedly disposed at constant intervals in the first direction, regardless of process variation, even when attempting miniaturization by disposing a plurality of trenches at a short pitch. Therefore, it is possible to prevent threshold voltage and on-state voltage from rising and to prevent breakdown resistance from decreasing, while maintaining a good trade-off between on-state voltage and switching loss, even when process variation occurs.

Second Embodiment

Figure 10:
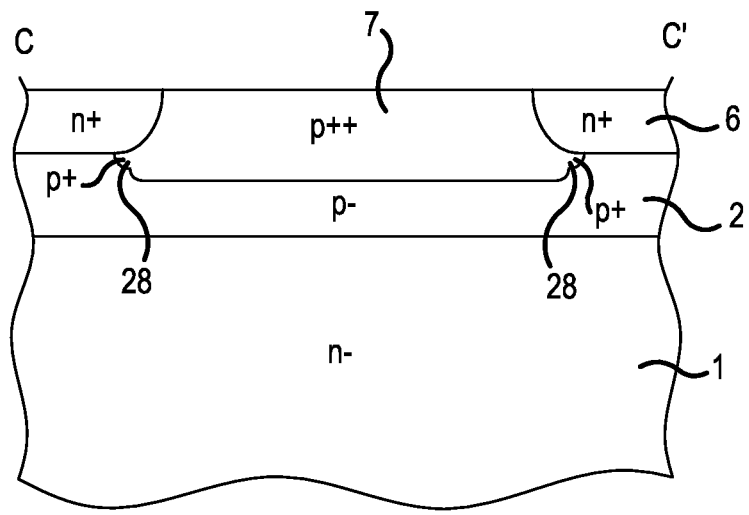
FIG. 10 is a sectional view showing main portions of a trench gate structure of a semiconductor device according to a second embodiment.

A description will be given of the structure of a semiconductor device according to a second embodiment. FIG. 10 is a sectional view showing main portions of a trench gate structure of the semiconductor device according to the second embodiment. FIG. 10 shows the sectional structure along the section line C-C' of FIG. 1. The planar layout of the trench gate structure, the sectional structure passing through the trench 3 and p⁺⁺-type contact region 7 (the section line A-A' of FIG. 1), and the sectional structure passing through the trench 3 and n⁺-type emitter region 6 (the section line B-B' of FIG. 1) are the same as in the first embodiment (refer to FIGS. 1 to 3). The semiconductor device according to the second embodiment differs from the semiconductor device according to the first embodiment in that the depth of a p⁺-type region 28 that covers an end portion on the lower side of the junction interface between the n⁺-type emitter region 6 and p⁺⁺-type contact region 7 is greater than the depth of the n⁺-type emitter region 6, and less than the depth of the p⁺⁺-type contact region 7.

Figure 11:
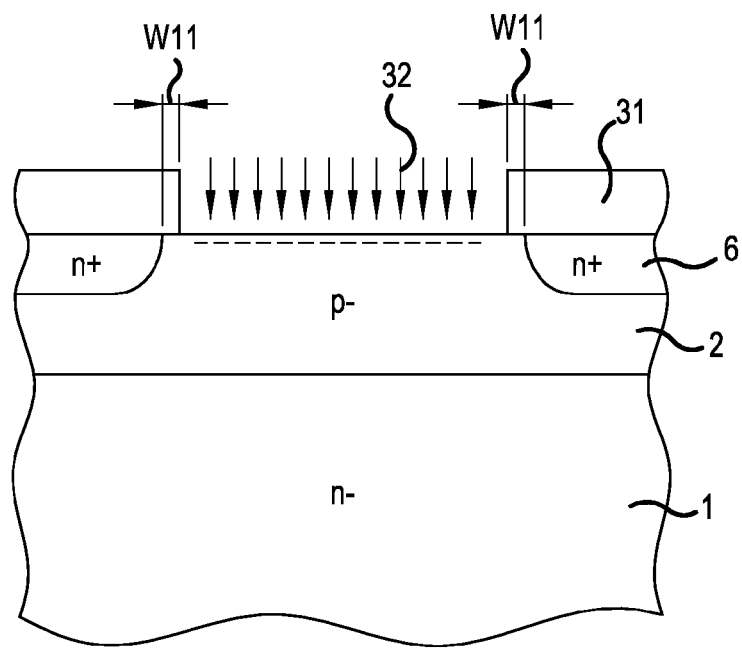
FIG. 11 is a sectional view showing a state partway through the manufacture of the semiconductor device according to the second embodiment.
Figure 12:
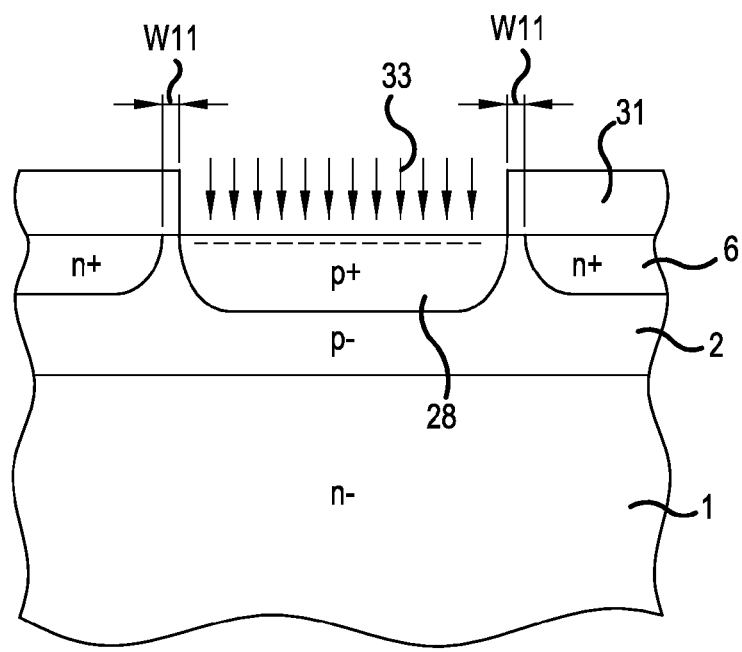
FIG. 12 is a sectional view showing a state partway through the manufacture of the semiconductor device according to the second embodiment.
Figure 13:
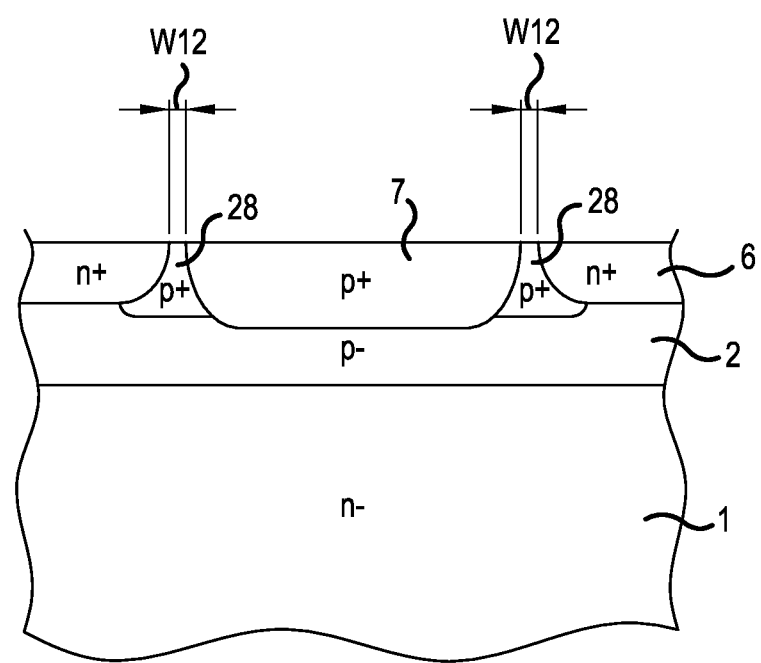
FIG. 13 is a sectional view showing a state partway through the manufacture of the semiconductor device according to the second embodiment.

In the second embodiment, it is sufficient that the p⁺-type region 28 is formed to be deeper than the n⁺-type emitter region 6 by a second ion implantation for forming the p⁺-type region 28. FIGS. 11 to 13 are sectional views showing states partway through manufacture of the semiconductor device according to the second embodiment. Specifically, firstly, the steps from the formation of the p⁻-type base region 2 to the formation of the n⁺-type emitter region 6 are carried out sequentially in the same way as in the first embodiment (refer to FIGS. 5 and 6). Next, a resist mask (second mask) 31 in which are opened portions corresponding to formation regions of the p⁺⁺-type contact region 7 is formed on the substrate front surface, as shown in FIG. 11. The preferred range of the interval W11 on the mask between the n⁺-type emitter region 6 and p⁺⁺-type contact region 7 neighboring in the first direction (that is, the interval between an aperture portion of the photomask pattern of the resist mask 31 and an aperture portion of the photomask pattern of the resist mask 11) is the same as in the first embodiment.

Next, with the resist mask 31 for forming the p⁺⁺-type contact region 7 as a mask, a second ion implantation 32 of a p-type impurity for forming the p⁺-type region 28 is carried out. The dotted line in the vicinity of the surface of the p⁻-type base region 2 in FIG. 11 indicates the p-type impurity implanted by the second ion implantation 32. A dopant with a diffusion coefficient with respect to silicon (Si) higher than that of the dopant used in a third ion implantation 33, to be described hereafter, for forming the p⁺⁺-type contact region 7 is used in the second ion implantation 32. By using the resist mask 31 for forming the p⁺⁺-type contact region 7, and using a dopant with a diffusion coefficient with respect to silicon higher than that of the dopant used in the third ion implantation 33, the width in the first direction of the p⁺-type region 28 can be greater than the width in the first direction of the p⁺⁺-type contact region 7 formed in a subsequent step. It is sufficient that the diffusion depth of the p⁺-type region 28 is regulated by the acceleration voltage of the second ion implantation 32 being lower than the acceleration voltage of the third ion implantation 33.

The $p^+$-type region 28 is formed by the second ion implantation 32 to be deeper than the $n^+$-type emitter region 6, and less deep than the $p^{++}$-type contact region 7 formed in a subsequent step, in $n^+$-type emitter regions 6 neighboring in the first direction, as shown in FIG. 12. A dopant such that the $p^+$-type region 28 can be diffused as far as a position wherein both ends in the first direction of the $p^+$-type region 28 are in contact with the $n^+$-type emitter regions 6 in a thermal processing to be described hereafter is selected as the dopant of the second ion implantation 32. When the dopant used in the third ion implantation 33 for forming the $p^{++}$-type contact region 7 is, for example, boron, aluminum (Al), for example, may be used as the dopant used in the second ion implantation 32 for forming the $p^+$-type region 28. Also, the diffusion coefficient of other impurities increases in the order of, for example, indium, boron, gallium, aluminum. Therefore, provided that the relationship between the diffusion coefficients of the dopant used in the third ion implantation 33 and the dopant used in the second ion implantation 32 is satisfied, the other impurities may be used as the dopants. Also, the second ion implantation 32 is carried out in a state wherein the $n^+$-type emitter region 6 is covered with the resist mask 31, as heretofore described. Therefore, the $p^+$-type region 28 is not formed in a portion of the $p^-$-type base region 2 sandwiched by the $n^+$-type emitter region 6 and $n^-$-type drift layer 1, even when the depth of the $p^+$-type region 28 is greater than the depth of the $n^+$-type emitter region 6.

Next, with the same resist mask 31 as that used in the formation of the $p^+$-type region 28 as a mask, the third ion implantation 33 of a p-type impurity such as boron is carried out in order to form the $p^{++}$-type contact region 7. The preferred range of the interval W11 on the mask between the $n^+$-type emitter region 6 and $p^{++}$-type contact region 7 neighboring in the first direction is the same as in the first embodiment. The dotted line in the vicinity of the surface of the $p^+$-type region 28 in FIG. 12 (a coarser dotted line than that in FIG. 11) indicates the p-type impurity implanted by the third ion implantation 33. The $p^{++}$-type contact region 7 is formed inside the $p^+$-type region 28 by the third ion implantation 33 so as to penetrate the $p^+$-type region 28 in the depth direction, reaching the $p^-$-type base region 2, as shown in FIG. 13.

The interval W12 between the $n^+$-type emitter region 6 and $p^{++}$-type contact region 7 neighboring in the first direction after the third ion implantation 33 is the same as in the first embodiment. Also, by forming the $p^+$-type region 28 and $p^{++}$-type contact region 7 using the same resist mask 31, the $p^{++}$-type contact region 7 can be formed in a central portion in the first direction of the $p^+$-type region 28, regardless of process variation. Also, by forming the $p^+$-type region 28 and $p^{++}$-type contact region 7 using the same resist mask 31, the manufacturing process can be simplified. Subsequently, the resist mask 31 is removed, and the trench gate IGBT shown in FIGS. 1, 2, 3, and 10 is completed by the steps from the thermal processing (thermal diffusion) onward being carried out sequentially in the same way as in the first embodiment.

As heretofore described, according to the second embodiment, the same advantages as in the first embodiment can be obtained. Also, according to the second embodiment, the curvature of the end portion in the first direction of the $p^{++}$-type contact region can be further increased, and unevenness occurring in the end portion on the lower side of the junction interface between the $n^+$-type emitter region and $p^{++}$-type contact region can be still further eliminated, by the depth of the $p^+$-type region being greater than the depth of the $n^+$-type emitter region. Therefore, electrical field concentration in the vicinity of the end portion on the lower side of the junction interface between the $n^+$-type emitter region and $p^{++}$-type contact region can be further relaxed.

Third Embodiment

Figure 14:
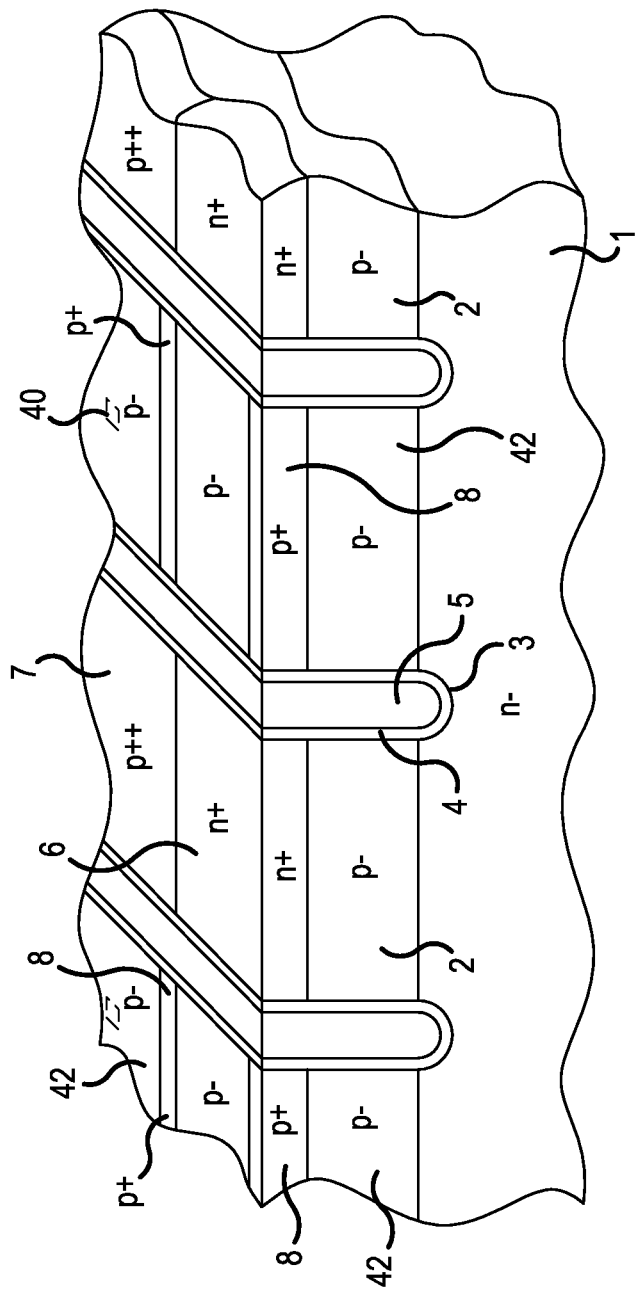
FIG. 14 is a perspective view showing main portions of a trench gate structure of a semiconductor device according to a third embodiment.

A description will be given of the structure of a semiconductor device according to a third embodiment. FIG. 14 is a perspective view showing main portions of a trench gate structure of the semiconductor device according to the third embodiment. The semiconductor device according to the third embodiment differs from the semiconductor device according to the first embodiment in that a mesa portion configured as a unit cell structure by providing the $n^+$-type emitter region 6, and a mesa portion configured as a $p^-$-type floating region 42 without providing the $n^+$-type emitter region 6, are disposed in the $p^-$-type base region 2 sandwiched by neighboring trenches 3. Specifically, a mesa portion configured as a unit cell formed of the $n^+$-type emitter region 6 and $p^{++}$-type contact region 7 and a mesa portion configured as the $p^-$-type floating region 42, which has emitter potential, are repeatedly alternately disposed in the second direction perpendicular to the first direction, in which the trenches 3 extend in stripe form.

In the third embodiment, the $p^+$-type region 8 is provided not only inside the $p^-$-type base region 2 in which the $n^+$-type emitter region 6 and $p^{++}$-type contact region 7 are provided, but also inside the $p^-$-type floating region 42. The formation of the $p^+$-type region 8 inside the $p^-$-type floating region 42 has a planar layout such that the $p^-$-type floating region 42 and $p^+$-type region 8 are repeatedly alternately disposed by selectively carrying out ion implantation using a mask. The $n^+$-type emitter region 6 and $p^{++}$-type contact region 7 are not provided in the $p^-$-type floating region 42. Therefore, the $p^+$-type region 8 is exposed in the surface of the $p^-$-type floating region 42 on the side opposite to the $n^-$-type drift layer 1 side.

The $p^+$-type region 8 formed in the $p^-$-type floating region 42 is electrically connected with an emitter electrode (not shown) via contact holes 40 that penetrate an interlayer dielectric (not shown). The contact holes 40 may be of a planar layout such that a rectangular or circular planar pattern is disposed in matrix form. By forming the $p^+$-type region 8 in the $p^-$-type floating region 42 in this way, switching loss Eoff can be reduced. The trench gate structure of the third embodiment is useful in an IGBT of a breakdown voltage class of for example, 1,200V. Also, the depth of the $p^+$-type region 8 may be variously regulated by applying the third embodiment to the second embodiment.

As heretofore described, according to the third embodiment, the same advantages as in the first and second embodiments can be obtained.

Examples

Figure 15:
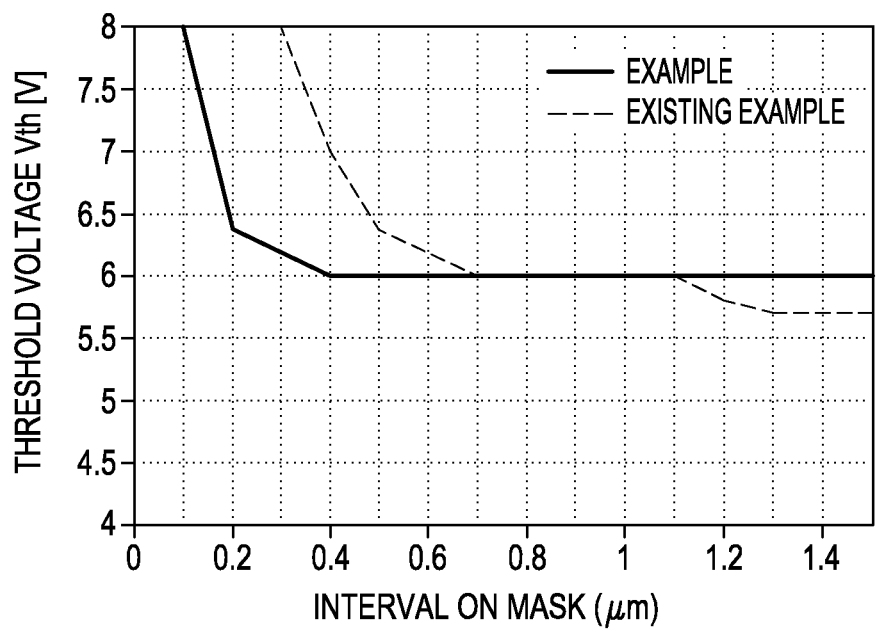
FIG. 15 is a characteristic diagram showing the threshold voltage characteristics of a semiconductor device according to an example.
Figure 16:
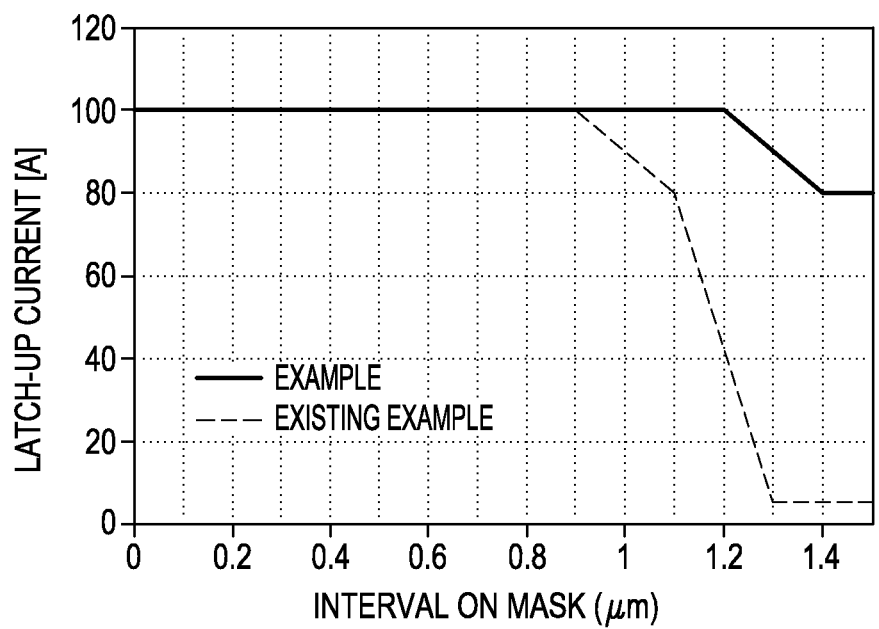
FIG. 16 is a characteristic diagram showing the latch-up current characteristics of the semiconductor device according to the example.
Figure 17:
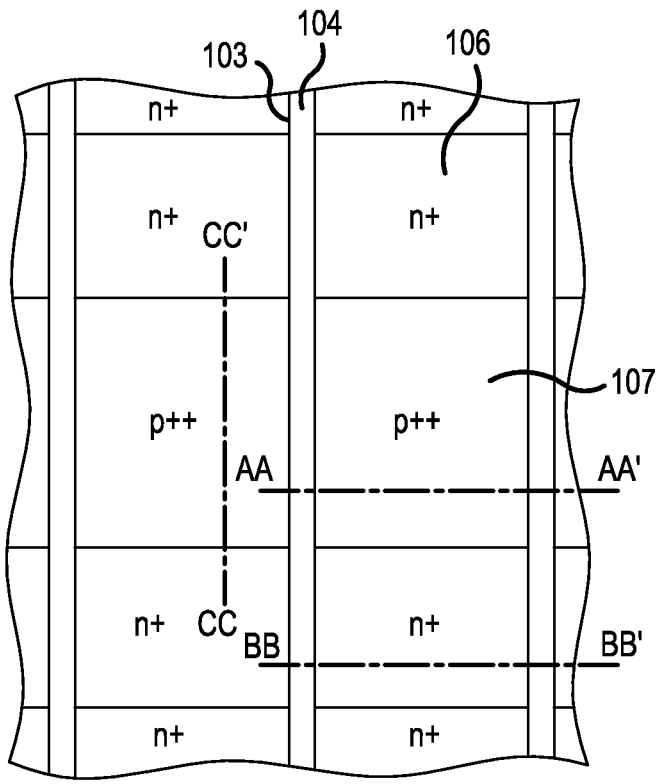
FIG. 17 is a plan view showing the planar layout of a trench gate structure of an existing semiconductor device.
Figure 18:
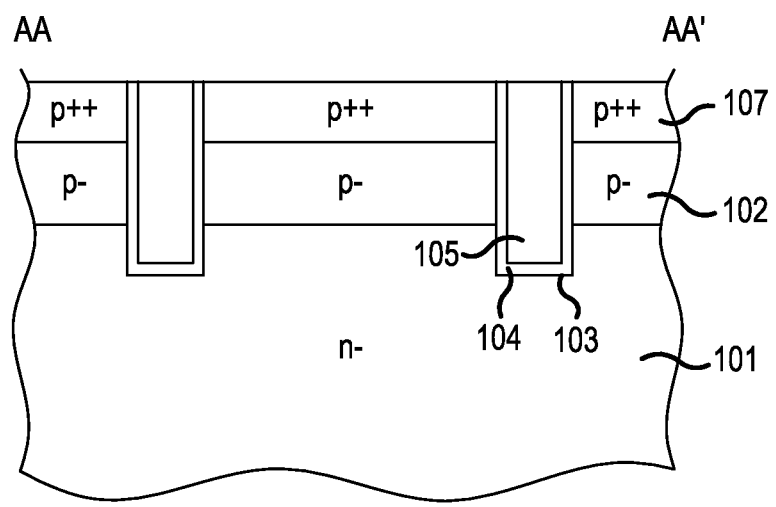
FIG. 18 is a sectional view showing the sectional structure along a section line AA-AA' of FIG. 17.
Figure 19:
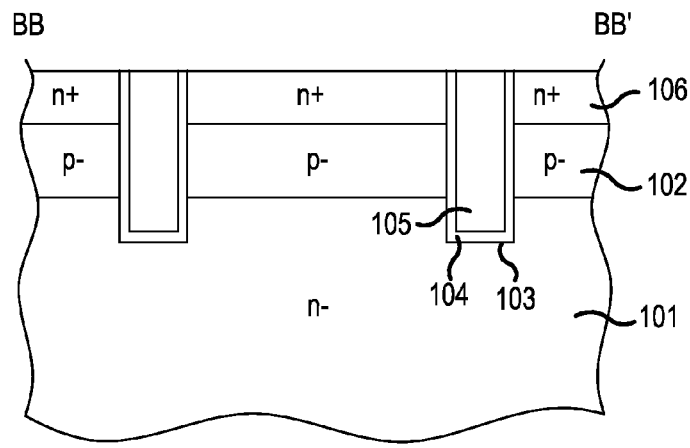
FIG. 19 is a sectional view showing the sectional structure along a section line BB-BB' of FIG. 17.
Figure 20:
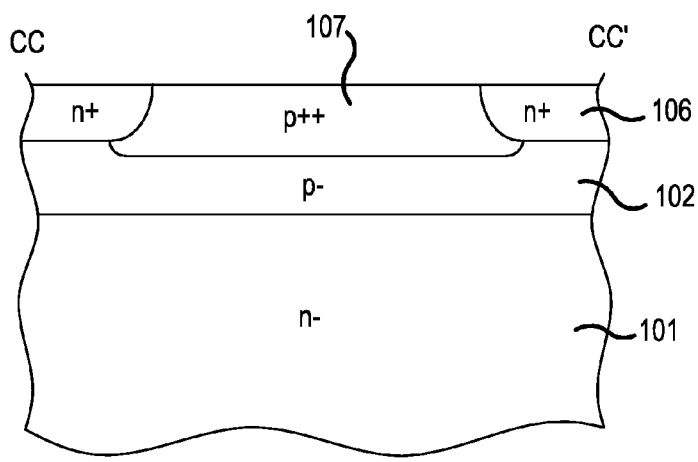
FIG. 20 is a sectional view showing the sectional structure along a section line CC-CC' of FIG. 17.

Next, the threshold voltage characteristics and latch-up current characteristics of the semiconductor device of the invention will be verified. FIG. 15 is a characteristic diagram showing the threshold voltage characteristics of the semiconductor device according to an example. FIG. 16 is a characteristic diagram showing the latch-up current characteristics of the semiconductor device according to the example. In FIG. 15, the interval W11 on the mask between the $n^+$-type emitter region 6 and $p^{++}$-type contact region 7 neighboring in the first direction is shown on the horizontal axis, while the threshold voltage Vth is shown on the vertical axis. In FIG. 16, the interval W11 on the mask between the n$^+$-type emitter region 6 and p$^{++}$-type contact region 7 neighboring in the first direction is shown on the horizontal axis, while the latch-up current is shown on the vertical axis.

Figure 21:
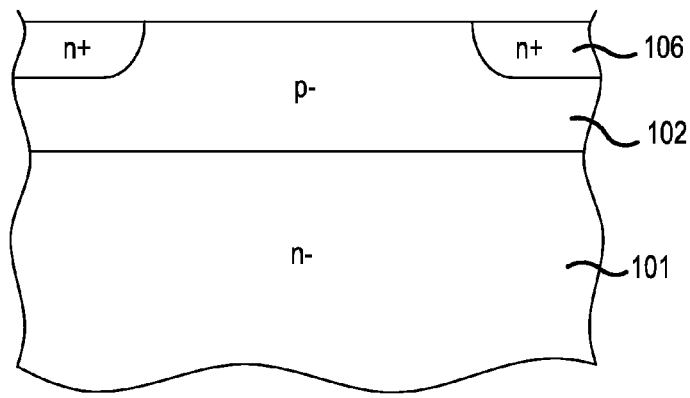
FIG. 21 is a sectional view showing a state partway through the manufacture of an existing semiconductor device.
Figure 22:
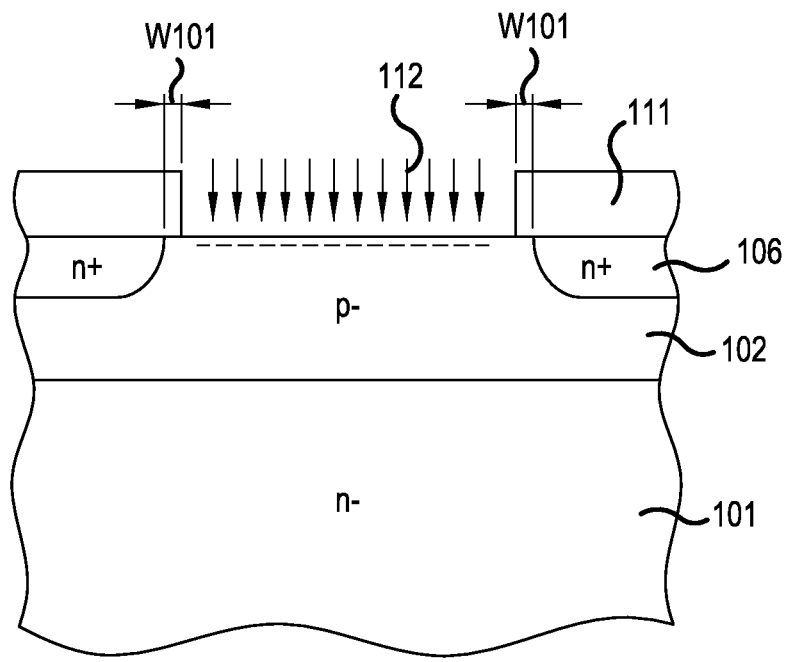
FIG. 22 is a sectional view showing a state partway through the manufacture of the existing semiconductor device.
Figure 23:
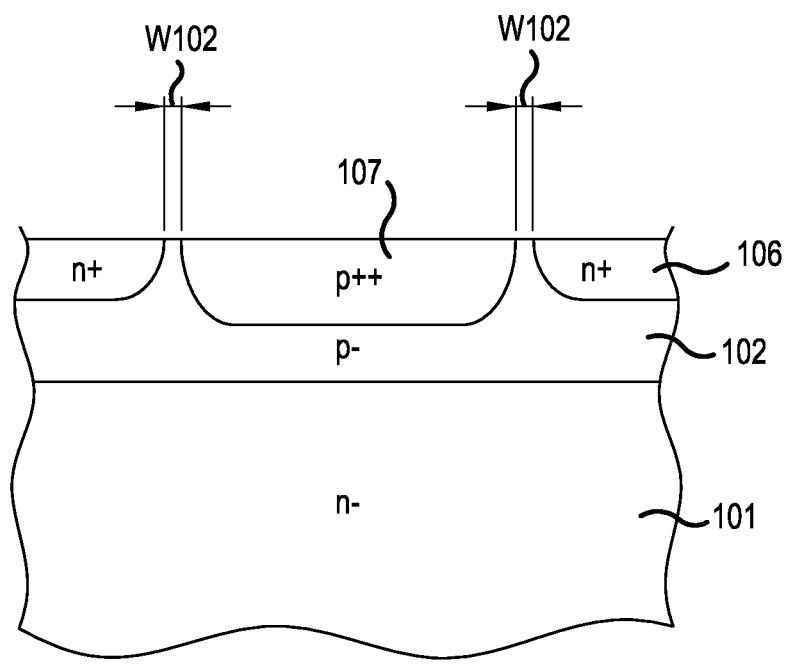
FIG. 23 is a sectional view showing a state partway through the manufacture of the existing semiconductor device.

Firstly, a plurality of trench gate IGBTs (samples) of a 600V breakdown voltage class are fabricated under the conditions given as examples above in accordance with the semiconductor device manufacturing method according to the first embodiment (hereafter referred to as the example). The interval W11 on the mask between the n$^+$-type emitter region 6 and p$^{++}$-type contact region 7 neighboring in the first direction differs in each sample of the example. The results of measuring the threshold voltage Vth of each sample of the example are shown in FIG. 15. Also, the results of measuring the latch-up current of each sample of the example, with the rated current at 10 A, are shown in FIG. 16. Also, the characteristics of a semiconductor device of the first existing structure (refer to FIGS. 17 to 20, hereafter referred to as an existing example) are shown as comparisons in each of FIGS. 15 and 16. The existing example is fabricated (manufactured) in accordance with the heretofore described existing semiconductor device manufacturing method (refer to FIGS. 21 to 23). Conditions of the existing example other than the front surface structure (first existing structure) are the same as those of the example.

From the results shown in FIG. 15, it is confirmed that in the example the threshold voltage Vth can be prevented from rising by the interval W11 on the mask between the n$^+$-type emitter region 6 and p$^{++}$-type contact region 7 neighboring in the first direction being 0.4 μm or greater. As opposed to this, it is confirmed that in the existing example the threshold voltage Vth rises over the whole range of an interval W101 on the mask between the n$^+$-type emitter region 6 and p$^{++}$-type contact region 7 neighboring in the first direction shown in FIG. 15. Also, from the results shown in FIG. 16, it is confirmed that in the example the latch-up current can be prevented from decreasing by the interval W11 on the mask between the n$^+$-type emitter region 6 and p$^{++}$-type contact region 7 neighboring in the first direction being 1.2 μm or less. Also, it is confirmed that in the example the interval W11 on the mask between the n$^+$-type emitter region 6 and p$^{++}$-type contact region 7 neighboring in the first direction can be set wider than in the existing example. Also, from the results above, it is confirmed that in the example it is preferable that the interval W11 on the mask between the n$^+$-type emitter region 6 and p$^{++}$-type contact region 7 neighboring in the first direction is 0.4 μm or greater, 1.21 μm or less.

The invention being applicable to any IGBT (a semiconductor device wherein the latch-up resistance is determined by the width in the first direction of the n$^+$-type emitter region), the dimensions, impurity concentrations, and the like, of each portion in the embodiments are variously set in accordance with the required specifications and the like. Specifically, the invention is applicable to, for example, a semiconductor device of a structure wherein a p$^-$-type floating region having floating potential or emitter potential is provided in a mesa portion sandwiched by neighboring trenches, a structure wherein a dummy gate electrode is provided inside the trench, or a structure wherein these structures are combined. A structure wherein a dummy gate electrode is provided inside the trench is a structure wherein a dummy gate electrode having emitter potential or floating potential is provided across a dummy gate dielectric inside the trench. Also, in the embodiments, descriptions are given with a 600V breakdown voltage class and 1,200V breakdown voltage class as examples, but the invention is also applicable to IGBTs of other breakdown voltage classes. Also, in the embodiments, the first conductivity type is n-type and the second conductivity type is p-type, but the invention is also established in the same way when the first conductivity type is p-type and the second conductivity type is n-type.

As heretofore described, the semiconductor device and semiconductor device manufacturing method according to the invention are useful in power semiconductor devices used in industrial machinery, automobiles, domestic electrical appliances, and the like.

Thus, a semiconductor device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A semiconductor device, comprising:
   a second conductivity type second semiconductor region provided on one surface side of a first conductivity type first semiconductor region;
   a plurality of trenches penetrating the second semiconductor region in the depth direction to reach the first semiconductor region and disposed in a stripe form planar pattern;
   a gate electrode provided across a gate dielectric inside the trench;
   a first conductivity type third semiconductor region selectively provided at predetermined intervals in a first direction in which the trench extends in stripe form in a mesa portion of the second semiconductor region sandwiched between neighboring trenches;
   a second conductivity type fourth semiconductor region, with an impurity concentration higher than that of the second semiconductor region, provided in contact with the third semiconductor region in the mesa portion so as to be repeatedly alternately disposed with the third semiconductor region in the first direction; and
   a second conductivity type fifth semiconductor region, with an impurity concentration higher than that of the second semiconductor region and an impurity concentration lower than that of the fourth semiconductor region, selectively provided so as to cover an end portion on the first semiconductor region side of the junction interface between the third semiconductor region and fourth semiconductor region,
   wherein the maximum depth of the fifth semiconductor region is equal to or less than the depth of the third semiconductor region.

2. A semiconductor device, comprising:
   a second conductivity type second semiconductor region provided on one surface side of a first conductivity type first semiconductor region;
   a plurality of trenches penetrating the second semiconductor region in the depth direction to reach the first semiconductor region and disposed in a stripe form planar pattern;
   a gate electrode provided across a gate dielectric inside the trench;
   a first conductivity type third semiconductor region selectively provided at predetermined intervals in a first direction in which the trench extends in stripe form in a mesa portion of the second semiconductor region sandwiched between neighboring trenches;

a second conductivity type fourth semiconductor region, with an impurity concentration higher than that of the second semiconductor region, provided in contact with the third semiconductor region in the mesa portion so as to be repeatedly alternately disposed with the third semiconductor region in the first direction; and a second conductivity type fifth semiconductor region, with an impurity concentration higher than that of the second semiconductor region and an impurity concentration lower than that of the fourth semiconductor region, selectively provided so as to cover an end portion on the first semiconductor region side of the junction interface between the third semiconductor region and fourth semiconductor region, wherein the maximum depth of the fifth semiconductor region is greater than the depth of the third semiconductor region and less than the depth of the fourth semiconductor region.

* * * * *